United States Patent
Matsukawa et al.

(10) Patent No.: US 12,055,580 B2
(45) Date of Patent: Aug. 6, 2024

(54) CIRCUIT BOARD INSPECTING APPARATUS

(71) Applicant: NIDEC READ CORPORATION, Kyoto (JP)

(72) Inventors: Toshihide Matsukawa, Kyoto (JP); Takashi Isa, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 47 days.

(21) Appl. No.: 17/913,840

(22) PCT Filed: Mar. 25, 2021

(86) PCT No.: PCT/JP2021/012538
§ 371 (c)(1),
(2) Date: Sep. 23, 2022

(87) PCT Pub. No.: WO2021/193824
PCT Pub. Date: Sep. 30, 2021

(65) Prior Publication Data
US 2023/0115469 A1    Apr. 13, 2023

(30) Foreign Application Priority Data
Mar. 26, 2020    (JP) ................................ 2020-056751

(51) Int. Cl.
*G01R 31/28*    (2006.01)
*G01S 17/04*    (2020.01)

(52) U.S. Cl.
CPC .......... *G01R 31/2808* (2013.01); *G01S 17/04* (2020.01)

(58) Field of Classification Search
CPC .. G01R 1/04; G01R 1/07328; G01R 31/2805; G01R 31/68
See application file for complete search history.

(56) References Cited

U.S. PATENT DOCUMENTS 9,347,988 B2    5/2016  Akiyama et al.
11,579,178 B1 *  2/2023  Lee ................... G01R 29/0871
(Continued)

FOREIGN PATENT DOCUMENTS

| | | |
|---|---|---|
| CN | 110858553 A | 3/2020 |
| JP | H04297809 A | 10/1992 |
| JP | H08213436 A | 8/1996 |

(Continued)

*Primary Examiner* — Tung X Nguyen
(74) *Attorney, Agent, or Firm* — VIERING, JENTSCHURA & PARTNER mbB

(57) ABSTRACT

A circuit board inspecting apparatus includes a rotary table having a mount surface, a rotary table support section, a suction device, a suction path having a first end connected to the suction device and a second end located at the mount surface, an adsorption mechanism that adsorbs the board onto the mount surface so that the suction device sucks in gas in the suction path, a flow rate detection section that detects a flow rate of gas flowing through a portion of the suction path, the portion located inside the rotary table support section, a flow rate determination section that determines whether the flow rate of the gas detected by the flow rate detection section is equal to or more than a predetermined value, a contactless detection section that detects a placement state of the board on the mount surface in a contactless manner, and an inspection section.

12 Claims, 7 Drawing Sheets

(56) References Cited

U.S. PATENT DOCUMENTS

2005/0062583 A1\* 3/2005 Naumov .............. B23K 26/351
338/195
2014/0043033 A1 2/2014 Butters et al.

FOREIGN PATENT DOCUMENTS

| JP | 2005101226 A | 4/2005 |
| --- | --- | --- |
| JP | 2006208208 A | 8/2006 |
| JP | 2008016532 A | 1/2008 |
| JP | 2017039176 A | 2/2017 |
| JP | 2019045231 A | 3/2019 |

\* cited by examiner

CIRCUIT BOARD INSPECTING APPARATUS

CROSS-REFERENCE TO RELATED APPLICATIONS

This is a U.S. National Stage Application of International Application No. PCT/JP2021/012538, filed on Mar. 25, 2021, and claims priority under 35 U.S.C. § 119(a) and 35 U.S.C. § 365(b) from Japanese Patent Application No. 2020-056751, filed on Mar. 26, 2020; the disclosures of which are incorporated herein by reference.

FIELD

Various embodiments of the present disclosure relate to a circuit board inspecting apparatus.

BACKGROUND

A circuit board inspecting apparatus is known, which is configured to inspect a board. A circuit board inspecting apparatus, for example, includes a board holding apparatus that inspects a board held on a mount surface of a stage.

In the board holding apparatus described above, the mount surface of the stage is perforated with a plurality of adsorption holes for adsorbing a lower surface of the board. According to the board holding apparatus, the board can be held on the mount surface with ease in such a manner that the board is vacuum-adsorbed through the adsorption holes.

In the board holding apparatus, the mount surface of the stage has ejection holes through which gas is blown on the lower surface of the board. The board holding apparatus includes pressure gauges respectively embedded in the vicinity of the ejection holes in the stage. The board holding apparatus adjusts a flow rate of the gas to be ejected through the ejection holes, in accordance with results of measurement by the pressure gauges.

The pressure gauges embedded in the stage are occasionally used for detecting whether the board is adsorbed on the mount surface of the stage. Specifically, each of the pressure gauges measures a pressure between the mount surface and the board, thereby detecting whether the board is adsorbed on the mount surface. In addition, since the pressure gauges are located near the mount surface, the pressure gauges are capable of accurately detecting an adsorption state of the board on the mount surface.

However, in a case where the stage is a rotary table that rotates about its axis of rotation, when the pressure gauges are embedded in the rotary table as described above, wires for the pressure gauges pass through a rotary portion of the rotary table. Consequently, the wires for the pressure gauges may twist due to the rotation of the rotary table. In order to prevent the wires from twisting, it is necessary to dispose the wires for the pressure gauges in the rotary table, using a rotary joint.

With a recent finer circuit pattern on a board, it has been required to improve the rotating accuracy of a rotary table for use in a circuit board inspecting apparatus. However, the use of the rotary joint for the rotary table may decrease the rotating accuracy of the rotary table due to friction, resistance, and the like at the rotary joint.

SUMMARY

An exemplary circuit board inspecting apparatus according to one embodiment of the present disclosure is a circuit board inspecting apparatus for inspecting a circuit board. This circuit board inspecting apparatus includes: a rotary table having a mount surface on which the circuit board is mountable while being adsorbed, the rotary table being rotatable about an axis of rotation as seen from the mount surface in plan view; a rotary table support section supporting the rotary table such that the rotary table is rotatable; a suction device; a suction path having a first end connected to the suction device and a second end located at the mount surface; an adsorption mechanism configured to adsorb the circuit board mounted on the mount surface onto the mount surface in such a manner that the suction device sucks in gas in the suction path; a flow rate detection section configured to detect a flow rate of gas flowing through a portion of the suction path, the portion located inside the rotary table support section; a flow rate determination section configured to determine whether the flow rate of the gas detected by the flow rate detection section is equal to or more than a predetermined value; a contactless detection section configured to detect a placement state of the circuit board on the mount surface in a contactless manner; and an inspection section configured to inspect the circuit board in accordance with results of detection by the flow rate determination section and contactless detection section.

The above and other elements, features, steps, characteristics and advantages of the present disclosure will become more apparent from the following detailed description of the embodiments with reference to the attached drawings.

DETAILED DESCRIPTION

Embodiments of the present disclosure will be described in detail below with reference to the drawings. In the respective drawings, identical or corresponding portions are denoted with identical reference signs; therefore, the description thereof will not be given repeatedly. In addition, the respective drawings do not faithfully illustrate the dimensions of actual constituent members, the dimensional ratios of the constituent members, and the like.

In the following direction, the term "up-and-down direction" refers to a vertical direction in a state in which a circuit board inspecting apparatus 1 is installed.

Figure 1:
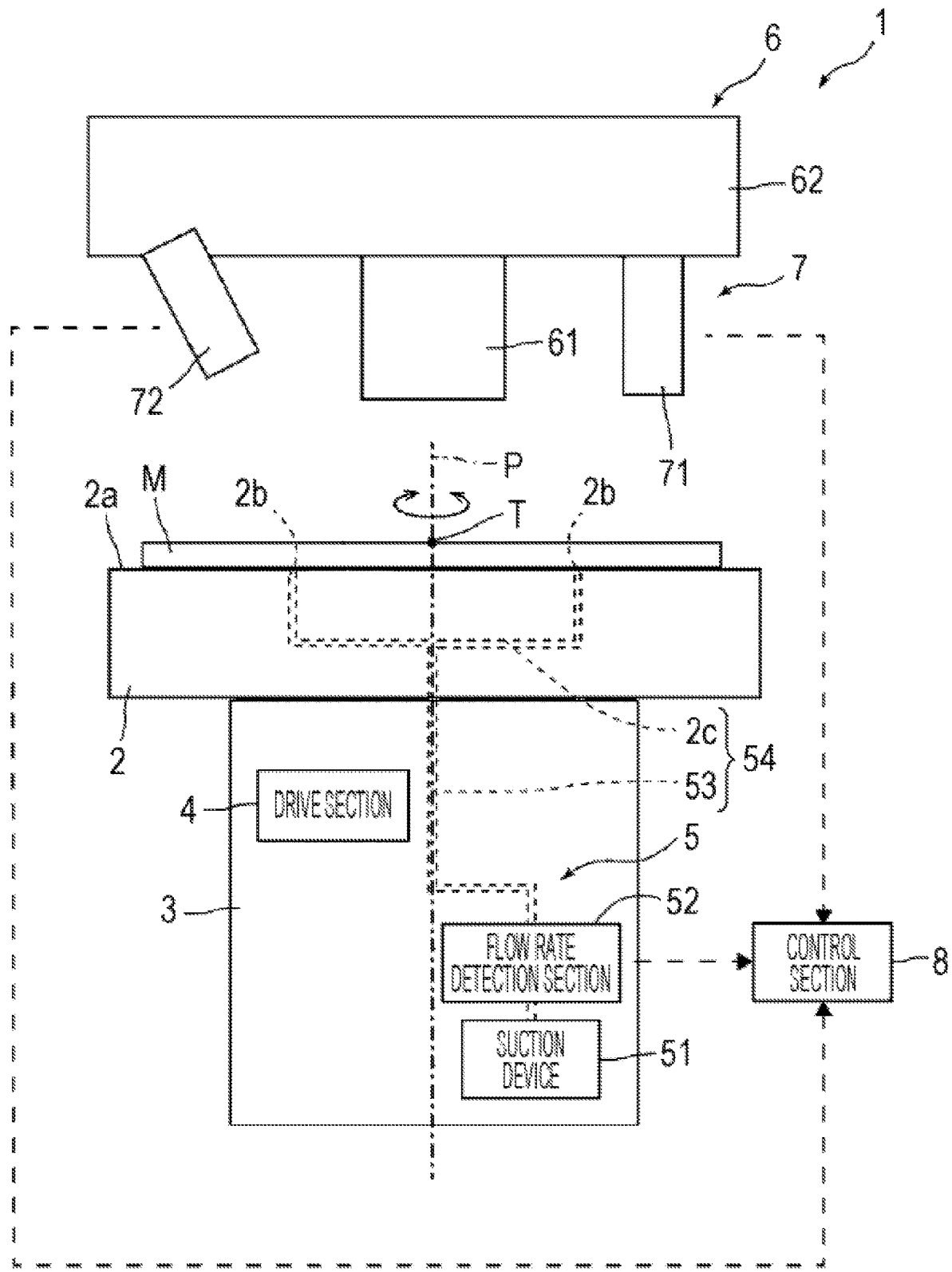
FIG. 1 is a diagram schematically illustrating a configuration of a circuit board inspecting apparatus according to a first embodiment.

FIG. 1 is a diagram illustrating a schematic configuration of a circuit board inspecting apparatus 1 according to an embodiment of the present disclosure. The circuit board inspecting apparatus 1 is an apparatus for inspecting a circuit board M mounted on a mount surface 2*a* of a rotary table 2. For example, the circuit board inspecting apparatus 1 tests continuity in an electric circuit of the circuit board M. In this embodiment, the circuit board M is made of a resin.

The circuit board inspecting apparatus 1 includes the rotary table 2, a rotary table support section 3, a drive section 4, an adsorption mechanism 5, an inspection section 6, a contactless detection section 7, and a control section 8.

The rotary table 2 is supported by the rotary table support section 3 so as to be rotatable about an axis of rotation P. In this embodiment, the rotary table 2 is movable in three directions orthogonal to each other. The rotary table 2 has a flat plate shape. The rotary table 2 has an upper surface corresponding to the mount surface 2a on which the circuit board M is mounted. The circuit board M is fixed to the rotary table 2 at a predetermined position on the mount surface 2a. The predetermined position is a position where the inspection section 6 (to be described later) is capable of inspecting the circuit board M in a state in which the circuit board M is held on the mount surface 2a.

Although not particularly illustrated, the rotary table 2 may include a claw portion or the like for fixing the circuit board M.

The mount surface 2a of the rotary table 2 is perforated with a plurality of adsorption holes 2b at a position where the circuit board M is held. The rotary table 2 has a gas pathway 2c formed therein and connected to the plurality of adsorption holes 2b. In other words, the plurality of adsorption holes 2b are located at a first end of the gas pathway 2c. The gas pathway 2c has a second end connected to a suction device 51 via a gas pipe 53 in the adsorption mechanism 5 (to be described later).

As will be described in detail later, the suction device 51 sucks in gas in the gas pathway 2c to generate negative pressure in the gas pathway 2c, so that the circuit board M can be adsorbed on the mount surface 2a in the vicinity of the plurality of adsorption holes 2b. The plurality of adsorption holes 2b and the gas pathway 2c constitute a part of the adsorption mechanism 5 (to be described later).

The rotary table support section 3 is located below the rotary table 2 and supports the rotary table 2 such that the rotary table 2 is rotatable. The rotary table support section 3 accommodates therein the drive section 4 as well as the suction device 51 and a flow rate detection section 52 of the adsorption mechanism 5.

The drive section 4 applies driving force to the rotary table 2 to cause the rotary table 2 to rotate about the axis of rotation P. The drive section 4 is, for example, a motor. The drive section 4 is accommodated in the rotary table support section 3. The drive section 4 may alternatively be located outside the rotary table support section 3.

The adsorption mechanism 5 is a mechanism that generates negative pressure in the vicinity of the plurality of adsorption holes 2b in the mount surface 2a of the rotary table 2 such that the circuit board M is adsorbed on the mount surface 2a. The adsorption mechanism 5 includes the suction device 51, the flow rate detection section 52, the gas pipe 53, the gas pathway 2c, and the plurality of adsorption holes 2b.

The suction device 51 is, for example, a device such as a vacuum pump capable of sucking in gas. The suction device 51 is accommodated in the rotary table support section 3. The suction device 51 is connected to the second end of the gas pathway 2c via the gas pipe 53 such that the gas is flowable into and out of the suction device 51. The suction device 51 may alternatively be located outside the rotary table support section 3.

The gas pipe 53 connects the suction device 51 and the gas pathway 2c in the rotary table 2. In other words, the gas pipe 53 constitutes a part of a suction path 54 connecting the suction device 51 and the gas pathway 2c in the rotary table 2. The suction path 54 according to an embodiment of the present disclosure is constituted of the inside of the gas pipe 53 and the gas pathway 2c in the rotary table 2.

The gas pipe 53 passes through a connection section where the rotary table 2 is rotatably connected to the rotary table support section 3.

The flow rate detection section 52 detects a flow rate of gas flowing through a portion of the gas pipe 53, the portion located inside the rotary table support section 3. The flow rate detection section 52 outputs a flow rate detection signal indicative of a result of the detection to the control section 8 of the circuit board inspecting apparatus 1.

The contactless detection section 7 includes a contactless detection sensor. This contactless detection sensor detects the presence or absence of a detection target and a position of the detection target in the up-and-down direction in contactless with the detection target, using, for example, light, laser light, sound, or the like.

In this embodiment, the contactless detection section 7 includes two types of contactless detection sensors. Specifically, the contactless detection section 7 includes a light sensor 71 and a laser light sensor 72.

In a case where light emitted from a light source (not illustrated) is reflected from the mount surface 2a of the rotary table 2 or a surface of the circuit board M, the light sensor 71 detects the reflected light. Therefore, the light sensor 71 irradiates the mount surface 2a of the rotary table 2 with light and detects the reflected light, thereby detecting the presence or absence of the circuit board M on the mount surface 2a. The light sensor 71 outputs a detection signal indicative of a result of the detection to the control section 8. The light sensor 71 corresponds to a circuit board contactless detection section according an embodiment of the present disclosure.

The laser light sensor 72 is a laser displacement gauge using laser light. In this embodiment, the laser light sensor 72 includes a light source that emits linear laser light. The laser light sensor 72 emits laser light to the circuit board M on the mount surface 2a of the rotary table 2 and detects the reflected light from the circuit board M, thereby detecting a height position of the circuit board M on the mount surface 2a. In the following description, the height position of the circuit board M on the mount surface 2a of the rotary table 2 is also referred to as an amount of floatation of the circuit board M.

The laser light sensor 72 detects the amount of floatation of the circuit board M in the vicinity of an inspection position T and outputs the position detection signal indicative of the detected amount of floatation to the control section 8. The laser light sensor 72 corresponds to a height position contactless detection section according to an embodiment of the present disclosure.

It should be noted that the inspection position T is a position at which a probe unit 61 of the inspection section 6 (to be described later) detects the circuit board M in contact with the circuit board M. The vicinity of the inspection position T covers not only the inspection position T, but also a range where the floatation of the circuit board M exerts an influence on an inspection by the inspection section 6 at the inspection position T. For example, the vicinity of the inspection position T refers to a portion closer to a contact position where the probe unit 61 of the inspection section 6 (to be described later) is in contact with the circuit board M, than an outer edge of the circuit board M is.

The inspection section 6 tests continuity in an electric circuit of the circuit board M. The inspection section 6 includes the probe unit 61 and an inspection main body 62.

The probe unit 61 includes a probe to be brought into contact with an electric wire constituting a part of the electric circuit of the circuit board M. The probe unit 61 feeds electric current to the electric circuit of the circuit board M via the probe and detects electric current passing through a predetermined portion. The probe unit 61 outputs a current detection signal indicative of the detected electric current to the control section 8 via the inspection main body 62. The probe unit 61 is supported by the inspection main body 62.

As described above, the probe unit 61 inspects the circuit board M in contact with the circuit board M. Therefore, the inspection position T on the circuit board M is equal to the contact position where the probe unit 61 is in contact with the circuit board M. The probe unit 61 corresponds to a contact inspection section according to an embodiment of the present disclosure.

The control section 8 makes a determination on the normality or abnormality of the electric circuit of the circuit board M, based on the received current detection signal. The control section 8 causes the inspection section 6 to carry out detection, in accordance with the flow rate detection signal received from the flow rate detection section 52 of the adsorption mechanism 5, the detection signal received from the light sensor 71, and the position detection signal received from the laser light sensor 72. In other words, the control section 8 causes the inspection section 6 to inspect the circuit board M when determining that the circuit board M is adsorbed at a predetermined position on the mount surface 2a of the rotary table 2, based on the flow rate detection signal and the detection signal, and also determining that the amount of floatation of the circuit board M is less than a specific value, based on the position detection signal. The control section 8 thus controls an inspection to be carried out in the circuit board inspecting apparatus 1.

Figure 2:
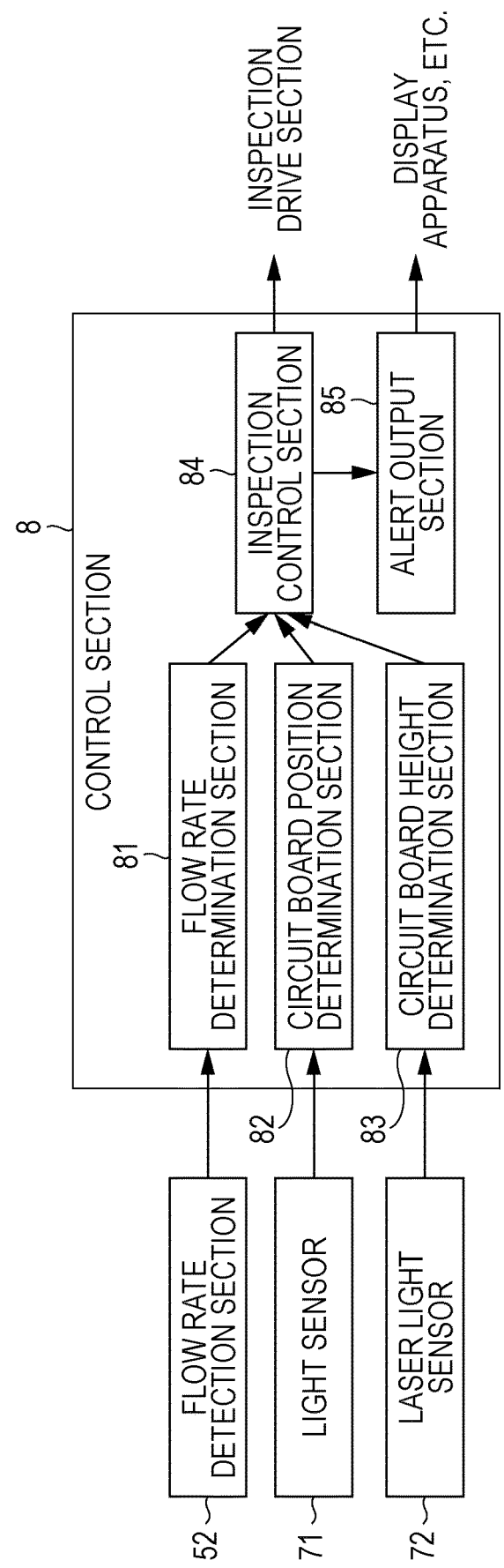
FIG. 2 is a functional block diagram illustrating a schematic configuration of a control section.

FIG. 2 is a functional block diagram illustrating a schematic configuration of the control section 8. The control section 8 includes a flow rate determination section 81, a circuit board position determination section 82, a circuit board height determination section 83, an inspection control section 84, and an alert output section 85.

The flow rate determination section 81 determines whether the flow rate of the gas at the gas pathway 2c is equal to or more than a predetermined value, using the flow rate detection signal received from the flow rate detection section 52. When the flow rate of the gas at the gas pathway 2c is equal to or more than the predetermined value, the flow rate determination section 81 generates an alert control signal and outputs the alert control signal to the inspection control section 84. When the flow rate of the gas at the gas pathway 2c is smaller than the predetermined value, the flow rate determination section 81 generates an inspection control signal and outputs the inspection control signal to the inspection control section 84.

The predetermined value refers to a flow rate of gas flowing through the gas pathway 2c in a state in which the circuit board M is not adsorbed on the mount surface 2a of the rotary table 2. A state in which the circuit board M is adsorbed on the mount surface 2a refers to a state in which the adsorption mechanism 5 fixes the circuit board M to the mount surface 2a to such an extent that the inspection section 6 is capable of inspecting the circuit board M.

The circuit board position determination section 82 determines whether the circuit board M is located at the predetermined position on the mount surface 2a of the rotary table 2, using the detection signal received from the light sensor 71 of the contactless detection section 7. When the circuit board M is located at the predetermined position on the mount surface 2a of the rotary table 2, the circuit board position determination section 82 outputs an inspection control signal to the inspection control section 84. When the circuit board M is not located at the predetermined position on the mount surface 2a of the rotary table 2, the circuit board position determination section 82 outputs an alert control signal to the inspection control section 84.

The circuit board height determination section 83 determines the floatation of the circuit board M, which is subjected to the inspection by the inspection section 6, in the vicinity of the inspection position T, using the position detection signal received from the laser light sensor 72 of the contactless detection section 7. When the amount of floatation of the circuit board M in the vicinity of the inspection position T is equal to or less than the specific value, the circuit board height determination section 83 outputs an inspection control signal to the inspection control section 84. When the amount of floatation of the circuit board M in the vicinity of the inspection position T is larger than the specific value, the circuit board height determination section 83 outputs an alert control signal to the inspection control section 84.

The specific value is set at such a value that the amount of floatation of the circuit board M exerts an influence on a result of the inspection by the probe unit 61. For example, the specific value is set at an amount of floatation that causes a change in a result of an inspection of the circuit board M in a case where the probe unit 61 is brought into contact with the circuit board M.

In a case where the circuit board M can be subjected to an inspection, that is, when the inspection control section 84 receives the inspection control signals from all of the flow rate determination section 81, the circuit board position determination section 82, and the circuit board height determination section 83, the inspection control section 84 drives an inspection drive section (not illustrated) of the circuit board inspecting apparatus 1 to inspect the circuit board M. It should be noted that the inspection drive section includes, for example, a drive section that moves the rotary table 2 upward, downward, or horizontally, a drive section for the inspection section 6, and the like.

In a case where the circuit board M cannot be subjected to an inspection, that is, when the inspection control section 84 receives the alert control signal from at least one of the flow rate determination section 81, the circuit board position determination section 82, and the circuit board height determination section 83, the inspection control section 84 outputs an alert signal to the alert output section 85.

Specific examples of the case where the inspection control section 84 outputs the alert signal may include, but not limited to, a case where the flow rate determination section 81 determines that the flow rate of the gas is equal to or more than the predetermined value, a case where the circuit board position determination section 82 determines that the circuit board M is not located at the predetermined position on the mount surface 2a of the rotary table 2, and a case where the circuit board height determination section 83 determines that the amount of floatation of the circuit board M is larger than the specific value.

The alert output section 85 causes a display apparatus or the like (not illustrated) to display an alert, in accordance with the alert signal received from the inspection control section 84.

With reference to a flowchart of FIG. 3, next, a description will be given of detection of the circuit board M to be carried out before an inspection of the circuit board M mounted on the mount surface 2a of the rotary table 2 in the circuit board inspecting apparatus 1 having the configuration described above.

Figure 3:
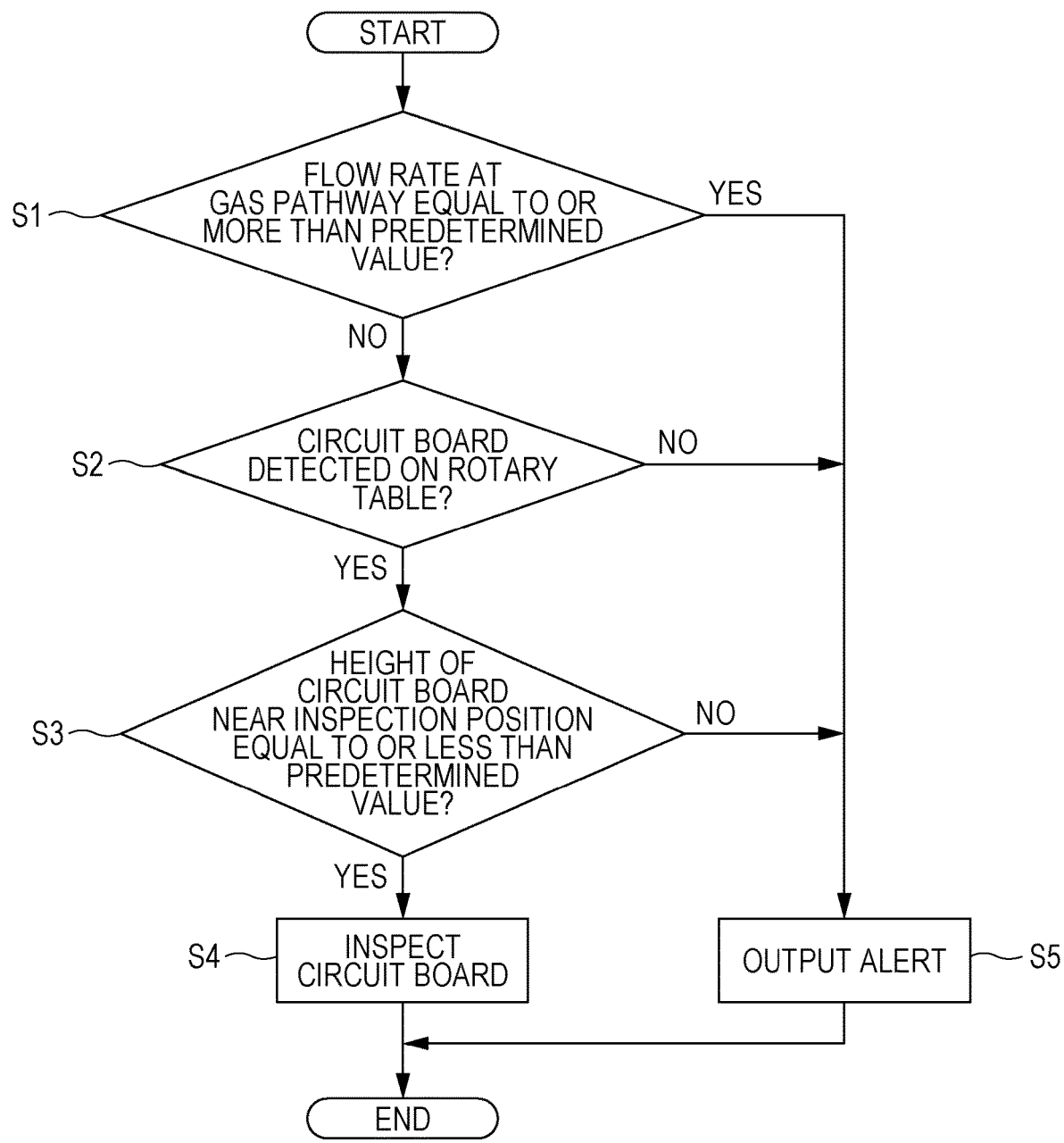
FIG. 3 is a flowchart illustrating a circuit board detection flow to be carried out before an inspection of a circuit board.

When a processing flow illustrated in FIG. 3 starts, first, the flow rate detection section 52 detects a flow rate of the gas flowing through the gas pathway 2c. The flow rate detection section 52 outputs a flow rate detection signal indicative of the detected flow rate to the control section 8. The flow rate determination section 81 of the control section 8 determines whether the flow rate of the gas flowing through the gas pathway 2c is equal to or more than the predetermined value, using the received flow rate detection signal.

When the flow rate determination section 81 of the control section 8 determines that the flow rate of the gas flowing through the gas pathway 2c is equal to or more than the predetermined value (i.e., "YES" in step S1 illustrated in FIG. 3), this processing flow proceeds to step S5 in which the alert output section 85 outputs an alert to a display screen or the like (not illustrated). In a case where the flow rate of the gas flowing through the gas pathway 2c is equal to or more than the predetermined value, it is considered that a clearance is created between the mount surface 2a of the rotary table 2 and the circuit board M and the gas flows through the clearance. This processing flow then ends.

On the other hand, when the flow rate determination section 81 of the control section 8 determines that the flow rate of the gas flowing through the gas pathway 2c is not equal to or more than the predetermined value (i.e., "NO" in step S1 illustrated in FIG. 3, this processing flow proceeds to step S2 in which the circuit board position determination section 82 of the control section 8 determines whether the circuit board M is located at the predetermined position on the rotary table 2.

In other words, in step S2, the light sensor 71 detects the circuit board M on the mount surface 2a of the rotary table 2. Specifically, the light sensor 71 detects a height of the mount surface 2a of the rotary table 2 at the predetermined position in a contactless manner using light, and outputs a detection signal indicative of a result of the detection. The light sensor 71 outputs the detection signal to the control section 8. The circuit board position determination section 82 of the control section 8 determines whether the circuit board M is located at the predetermined position on the mount surface 2a of the rotary table 2, using the detection signal.

When the circuit board position determination section 82 of the control section 8 determines that the circuit board M is located at the predetermined position on the mount surface 2a of the rotary table 2 (i.e., "YES" in step S2 illustrated in FIG. 3), this processing flow proceeds to step S3 in which the circuit board position determination section 82 determines a height of the circuit board M in the vicinity of the inspection position T. On the other hand, when the circuit board position determination section 82 of the control section 8 determines that the circuit board M is not located at the predetermined position on the mount surface 2a of the rotary table 2 (i.e., "NO" in step S2 illustrated in FIG. 3), this processing flow proceeds to step S5 in which the alert output section 85 of the control section 8 outputs an alert to the display screen or the like (not illustrated).

In step S3, the laser light sensor 72 detects the height of the circuit board M in the vicinity of the inspection position T. The laser light sensor 72 detects the height of the circuit board M in the vicinity of the inspection position T in a contactless manner using laser light, and outputs a position detection signal indicative of a result of the detection. The laser light sensor 72 outputs the position detection signal to the control section 8. The circuit board height determination section 83 of the control section 8 determines whether the height of the circuit board M in the vicinity of the inspection position T is equal to or less than the predetermined value, using the position detection signal.

When the circuit board height determination section 83 of the control section 8 determines that the height of the circuit board M in the vicinity of the inspection position T is equal to or less than the predetermined value (i.e., "YES" in step S3 illustrated in FIG. 3), this processing flow proceeds to step S4 in which the inspection control section 84 of the control section 8 inspects the circuit board M. Specifically, the inspection control section 84 outputs a drive signal to the inspection drive section (not illustrated) of the circuit board inspecting apparatus 1. This processing flow then ends.

Figure 4:
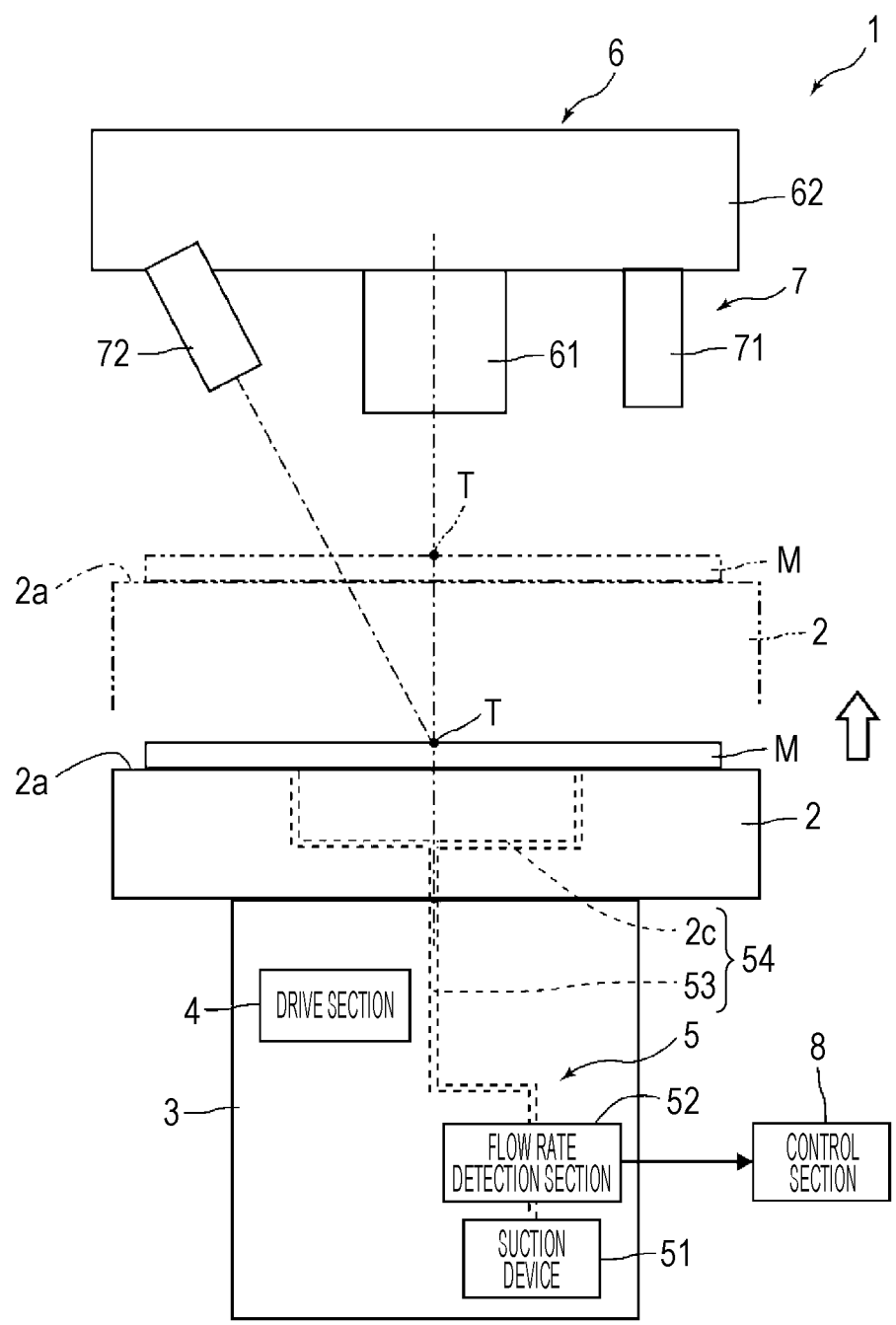
FIG. 4 is a diagram schematically illustrating a laser light sensor that detects floatation of the circuit board.

As illustrated in FIG. 4, the laser light sensor 72 detects the height of the circuit board M in the vicinity of the inspection position T, at a position lower than the position where the probe unit 61 of the inspection section 6 is in contact with the circuit board M. In the case of "YES" in step S3 as described above, therefore, the inspection drive section moves the rotary table 2 upward as indicated by a white arrow mark in FIG. 4 to thereby bring the circuit board M into contact with the probe unit 61. In the circuit board inspecting apparatus 1, the rotary table 2 may be fixed whereas the probe unit 61 may be movable in the up-and-down direction.

On the other hand, when the circuit board height determination section 83 of the control section 8 determines that the height of the circuit board M in the vicinity of the inspection position T is not equal to or less than the predetermined value (i.e., "NO" in step S3 illustrated in FIG. 3, this processing flow proceeds to step S5 in which the alert output section 85 of the control section 8 outputs an alert to the display screen or the like (not illustrated).

Figure 5:
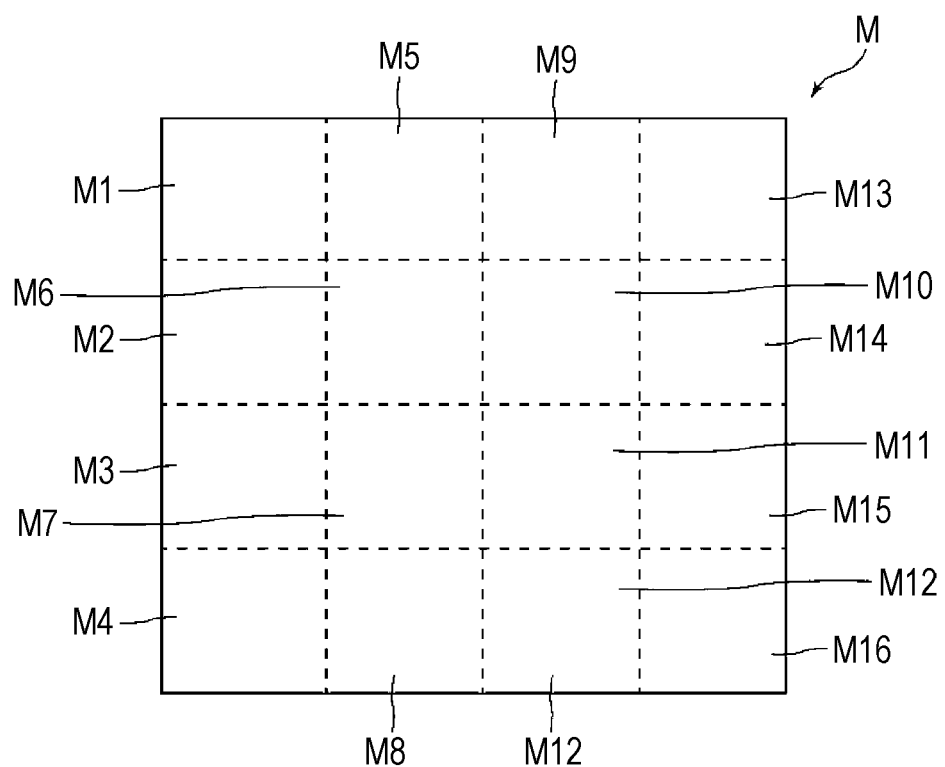
FIG. 5 is a plan view illustrating a schematic configuration of the circuit board including a plurality of board pieces.

The foregoing processing flow is carried out for each electric circuit of the circuit board M at the inspection position T prior to the inspection. As illustrated in FIG. 5, specifically, in a case where the circuit board M includes a plurality of board pieces M1 to M16 on which the electric circuits are fabricated, the circuit board inspecting apparatus 1 detects the circuit board M through the foregoing processing flow, prior to an inspection of each of the plurality of board pieces M1 to M16. With this configuration, in inspecting each of the plurality of board pieces M1 to M16 of the circuit board M, the probe unit 61 of the inspection section 6 can be brought into electric connection to the electric circuit on each of the plurality of board pieces M1 to M16 more reliably.

It should be noted that the circuit board M does not necessarily include a plurality of board pieces. That is, the circuit board M may be a board that is not divided in a product state.

Through the foregoing processing flow, the circuit board inspecting apparatus 1 is capable of detecting the adsorption state of the circuit board M on the mount surface 2a of the rotary table 2, detecting whether the circuit board M is located at the predetermined position on the mount surface 2a of the rotary table 2, and detecting the amount of floatation of the circuit board M from the mount surface 2a in the vicinity of the inspection position T on the circuit board M, and is capable of outputting an alert or inspecting the circuit board M in accordance with results of the detection.

Specifically, in a case where the amount of floatation of the circuit board M from the mount surface 2a in the vicinity of the inspection position T on the circuit board M is small in a state in which the circuit board M is adsorbed on the mount surface 2a of the rotary table 2 at the predetermined position on the mount surface 2a, the circuit board inspecting apparatus 1 inspects the circuit board M.

On the other hand, in a case where the circuit board M is not adsorbed on the mount surface 2a of the rotary table 2, in a case where the circuit board M is not located at the predetermined position on the mount surface 2a of the rotary table 2, or in a case where the amount of floatation of the circuit board M from the mount surface 2a in the vicinity of the inspection position T on the circuit board M is large, the circuit board inspecting apparatus 1 outputs an alert to issue a notification to an operator of the circuit board inspecting apparatus 1.

As described above, the circuit board inspecting apparatus 1 according to this embodiment is a circuit board inspecting apparatus for inspecting a circuit board M. The circuit board inspecting apparatus 1 includes: a rotary table 2 having a mount surface 2a on which the circuit board M is mountable while being adsorbed, the rotary table 2 being rotatable about an axis of rotation P as seen from the mount surface 2a in plan view; a rotary table support section 3 supporting the rotary table 2 such that the rotary table 2 is rotatable; a suction device 51; a suction path 54 having a first end connected to the suction device 51 and a second end located at the mount surface 2a; an adsorption mechanism 5 configured to adsorb the circuit board M mounted on the mount surface 2a onto the mount surface 2a in such a manner that the suction device 51 sucks in gas in the suction path 54; a flow rate detection section 52 configured to detect a flow rate of gas flowing through a portion of the suction path 54, the portion located inside the rotary table support section 3; a flow rate determination section 81 configured to determine whether the flow rate of the gas detected by the flow rate detection section 52 is equal to or more than a predetermined value; a contactless detection section 7 configured to detect a placement state of the circuit board M on the mount surface 2a in a contactless manner; and an inspection section 6 configured to inspect the circuit board M in accordance with results of detection by the flow rate determination section 81 and contactless detection section 7.

It is considered that, in order to detect an adsorption state of the circuit board M on the mount surface 2a of the rotary table 2, a pressure sensor for detecting a pressure between the mount surface 2a and the circuit board M is embedded in the rotary table 2. In this case, since a wire for the pressure gauge passes through a rotary portion of the rotary table 2, a rotary joint is used for the rotary portion. However, the use of the rotary joint may decrease the rotating accuracy of the rotary table due to friction, resistance, and the like at the rotary joint.

The circuit board inspecting apparatus to which the configuration according to this embodiment is applied is capable of accurately detecting the adsorption state and placement state of the circuit board M on the mount surface 2a of the rotary table 2 without the use of a pressure sensor to be embedded in the rotary table 2. According to the foregoing configuration, moreover, the flow rate detection section 52 and the contactless detection section 7 are located outside the rotary table 2.

Therefore, since wires for the flow rate detection section 52 and contactless detection section 7 are also located outside the rotary table 2, there is no necessity to use a rotary joint allowing a wire for a sensor located inside the rotary table 2 to pass therethrough, as a connection section between the rotary table 2 and the rotary table support section 3. This configuration thus enables decrease in sliding resistance of the rotary table 2 to the rotary table support section 3. This configuration therefore enables improvement in rotating accuracy of the rotary table 2.

The adsorption state refers to a state in which the circuit board M is adsorbed on the mount surface 2a of the rotary table 2 to such an extent that the inspection section 6 is capable of inspecting the circuit board M. In the case where the circuit board M is adsorbed on the mount surface 2a of the rotary table 2, a flow rate of gas to be detected by the flow rate detection section 52 is smaller than the predetermined value.

The placement state refers to, for example, the position of the circuit board M on the mount surface 2a of the rotary table 2 and the presence or absence of floatation of the circuit board M from the mount surface 2a. In the case where the circuit board M is located at the predetermined position on the mount surface 2a of the rotary table 2, the contactless detection section 7 is capable of detecting the presence of the circuit board M. The contactless detection section 7 is also capable of detecting the floatation of the circuit board M from the mount surface 2a of the rotary table 2.

The inspection section 6 inspects the circuit board M when the flow rate determination section 81 determines that the flow rate of the gas detected by the flow rate detection section 52 is smaller than the predetermined value and when the contactless detection section 7 detects that the circuit board M is placed on the mount surface 2a in a predetermined state.

In the case where the flow rate determination section 81 determines that the flow rate of the gas detected by the flow rate detection section 52 is smaller than the predetermined value, the circuit board M is adsorbed on the mount surface 2a of the rotary table 2. As described above, in the state in which the circuit board M is adsorbed on the mount surface 2a of the rotary table 2 and in the case where the circuit board M is placed on the mount surface 2a in the predetermined state, the inspection section 6 is capable of accurately inspecting the circuit board M. In the foregoing case, therefore, the inspection section 6 is capable of inspecting the circuit board M while suppressing variations in a result of the inspection of the circuit board M.

The predetermined state refers to, for example, a state in which the circuit board M is located at the predetermined position on the mount surface 2a of the rotary table 2, and a state in which the amount of floatation of the circuit board M from the mount surface 2a of the rotary table 2 is equal to or less than a specific value.

The inspection section 6 includes a probe unit 61 configured to inspect the circuit board M in contact with the circuit board M. The contactless detection section 7 includes: a light sensor 71 configured to detect the presence or absence of the circuit board M on the mount surface 2a in a contactless manner; and a laser light sensor 72 configured to detect a height of the circuit board M relative to the mount surface 2a in a portion closer to a contact position where the probe unit 61 is in contact with the circuit board M than an outer edge of the circuit board M is, in a contactless manner. The predetermined state to be detected by the contactless detection section 7 includes a case where the light sensor 71 detects that the circuit board M is located at the predetermined position on the mount surface 2a and a case where the laser light sensor 72 detects that the height position of the circuit board M relative to the mount surface 2a is equal to or less than the predetermined value.

With this configuration, the light sensor 71 and the laser light sensor 72 are used as the contactless detection section 7 and are used selectively in detecting the placement state of the circuit board M, thereby accurately detecting the placement state of the circuit board M on the mount surface 2a of the rotary table 2.

That is, the light sensor 71 which is typically low in detection accuracy is used for detecting that the circuit board M is located at the predetermined position on the mount surface 2a of the rotary table 2. On the other hand, the laser light sensor 72 which is relatively high in detection accuracy is used for detecting the amount of floatation of the circuit board M from the mount surface 2a of the rotary table 2. With this configuration, the circuit board inspecting apparatus 1 is capable of accurately detecting the placement state of the circuit board M in accordance with sensitivity regions of the contactless sensors.

The laser light sensor 72 detects a height of the contact position, where the probe unit 61 is in contact with the circuit board M, relative to the mount surface 2a in a contactless manner. With this configuration, the circuit board inspecting apparatus 1 is capable of accurately detecting the amount of floatation of the circuit board M in the vicinity of the inspection position. Therefore, the circuit board inspecting apparatus 1 inspects the circuit board M in accordance with a result of detection by the laser light sensor 72, thereby inspecting the circuit board M with the probe unit 61 reliably brought into contact with the circuit board M. The circuit board inspecting apparatus 1 thus inspects the circuit board M with improved accuracy.

The circuit board M includes a plurality of board pieces M1 to M16 each having an electric circuit fabricated thereon. Prior to an inspection of the electric circuit on each board piece, the flow rate determination section 81 determines that the flow rate of the gas detected by the flow rate detection section 52 is smaller than the predetermined value and the contactless detection section 7 detects the placement state of the circuit board M on the mount surface 2a, and then the inspection section 6 inspects each electric circuit.

With this configuration, even in the case where the circuit board M includes the plurality of board pieces M1 to M16, the circuit board inspecting apparatus 1 is capable of easily detecting the adsorption state and placement state of the circuit board M on the mount surface 2a of the rotary table 2, prior to an inspection of the electric circuit on each board piece. In the foregoing description, the board pieces M1 to M16 are exemplified; however, the number of boards may be any number.

Figure 6:
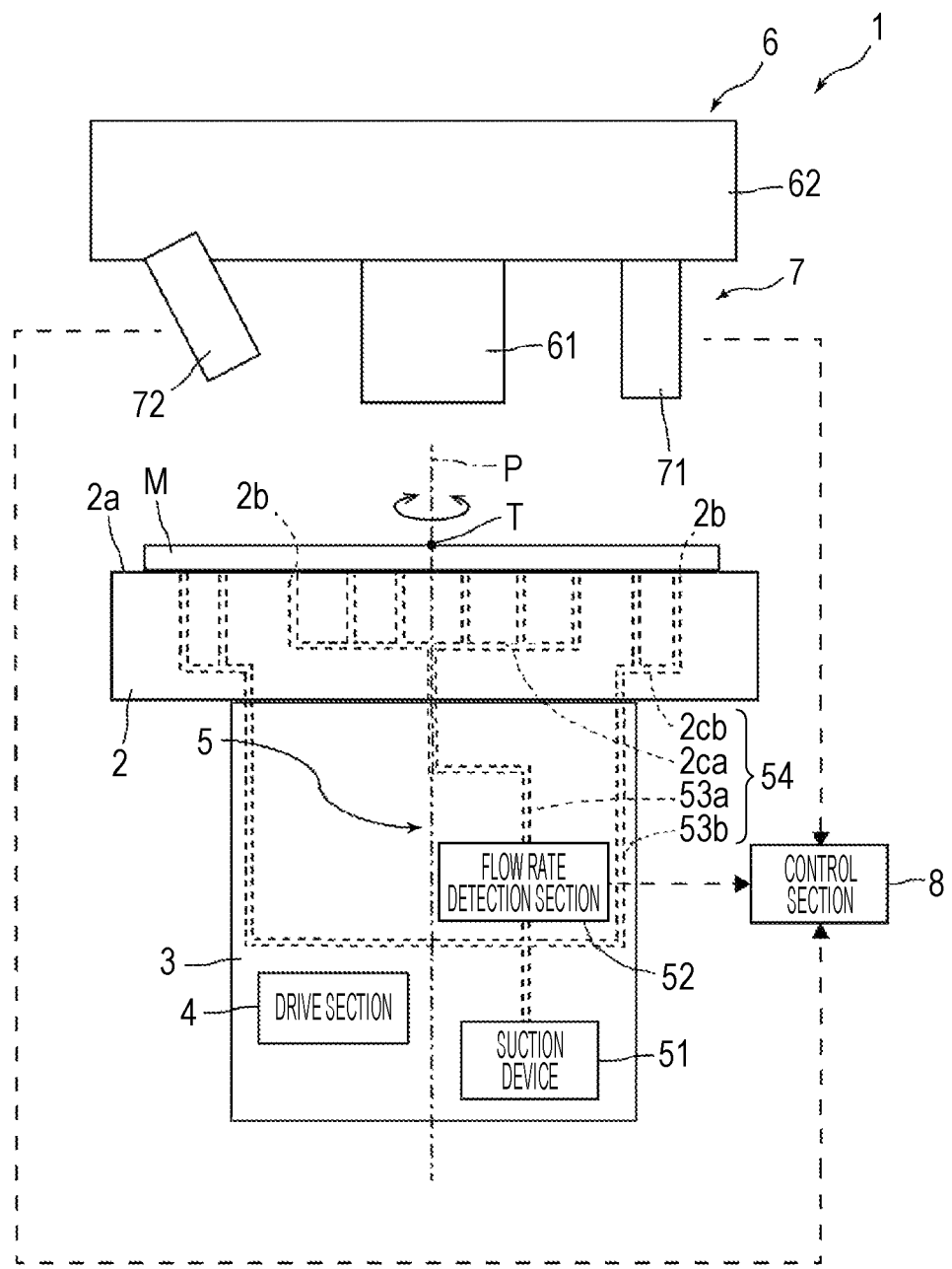
FIG. 6 is a diagram schematically illustrating a configuration of a circuit board inspecting apparatus according to a second embodiment.

FIG. 6 is a diagram illustrating a schematic configuration of a circuit board inspecting apparatus 1 according to a second embodiment. The second embodiment is different from the first embodiment in respects that the suction path described in the first embodiment is divided into a central gas pathway 2ca and a central gas pipe 53a each located at the center of a mount surface, and an outer peripheral gas pathway 2cb and an outer peripheral gas pipe 53b each located radially outside the central gas pathway 2ca, and a flow rate detection section 52 detects a flow rate of gas flowing through a portion of the central gas pipe 53a, the portion located inside a rotary table support section 3 on the central gas pathway 2ca. Other similar configurations are not described here.

The central gas pathway 2ca has a first end connected to a suction device 51 and a second end located near the center of the mount surface 2a. The outer peripheral gas pathway 2cb has a first end connected to the suction device 51 and a second end located radially outside the central gas pathway 2ca. As used herein, the center of the mount surface refers to a portion of the mount surface 2a near an axis of rotation P of a rotary table 2, the portion covering a point where the axis of rotation P passes. In other words, the center of the mount surface refers to a portion covered with a circuit board M when the circuit board M is placed on the mount surface 2a. The outer peripheral gas pathway 2cb is located radially outside the central gas pathway 2ca.

The central gas pipe 53a connects the suction device 51 and the central gas pathway 2ca in the rotary table 2. The outer peripheral gas pipe 53b connects the suction device 51 and the outer peripheral gas pathway 2cb in the rotary table 2. The central gas pipe 53a constitutes a part of a central suction path connecting the suction device 51 and the central gas pathway 2ca in the rotary table 2. The outer peripheral gas pipe 53b constitutes a part of an outer peripheral suction path connecting the suction device 51 and the outer peripheral gas pathway 2cb in the rotary table 2.

For example, if a board is warped largely, a clearance is likely to be created between the outer periphery of the board and the mount surface when the board is placed on the mount surface. It is therefore considered that a suction path near the outer periphery of the board is incapable of satisfactory suction of the board. According to this embodiment, the flow rate detection section 52 detects the flow rate of the gas flowing through the portion of the central suction path, the portion located inside the rotary table support section 3. A clearance between the mount surface and the center of the board placed on the mount surface is smaller than the clearance between the mount surface and the outer periphery of the board. Therefore, a flow rate of gas flowing through the central gas pathway 2ca is less likely to increase above a predetermined value. Therefore, the board can be detected with improved accuracy by detecting the flow rate of the gas flowing through the portion of the central suction path, the portion located inside the rotary table support section 3.

The intake device 51 may be provided for each of the central gas pipe 53a and the outer peripheral gas pipe 53b. However, connecting the intake device 51 to both the central gas pipe 53a and the outer peripheral gas pipe 53b results in space saving.

The foregoing description concerns embodiments of the present disclosure; however, each of the foregoing embodiments is merely an example for embodying the present disclosure. The present disclosure is not limited to the foregoing embodiments, and the foregoing embodiments may be appropriately modified within a range not departing from the scope of the present disclosure.

According to each of the foregoing embodiments, the contactless detection section 7 includes two types of sensors, that is, the light sensor 71 and the laser light sensor 72. The contactless detection section may alternatively include one of the light sensor and the laser light sensor. In this case, one of the sensors may determine the presence or absence of a circuit board on the mount surface of the rotary table and may detect an amount of floatation of the circuit board in the vicinity of the inspection position of the circuit board. The contactless detection section may alternatively include any sensor different from a light sensor and a laser light sensor. The contactless detection section may include three or more contactless sensors.

The detection by the contactless detection section may be omitted as long as the flow rate detection section is capable of accurately detecting the placement state of the board as described in the second embodiment.

Figure 7:
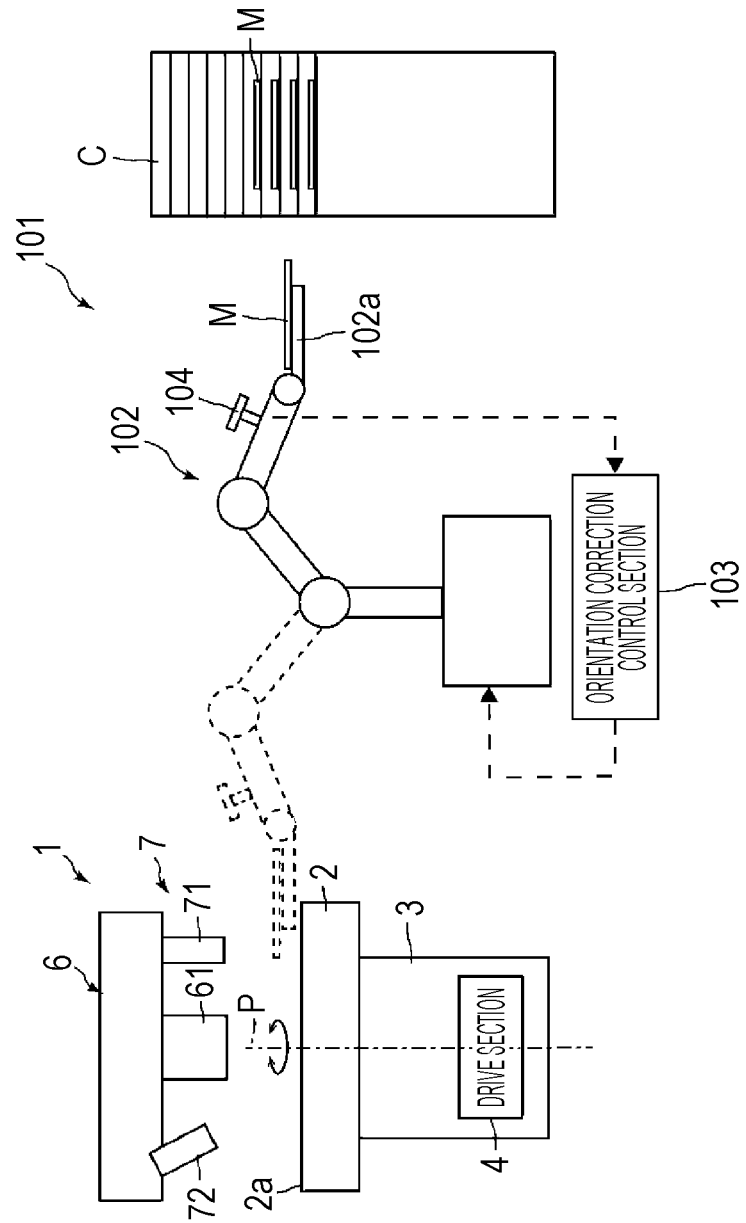
FIG. 7 is a schematic diagram illustrating a transfer apparatus that mounts a circuit board on a mount surface of a rotary table.

Each of the foregoing embodiments describes an example concerning detection of a circuit board M on the mount surface 2a of the rotary table 2. In mounting a circuit board M on the mount surface 2a of the rotary table 2, a transfer apparatus may be used for moving the circuit board M while controlling an orientation of the circuit board M. FIG. 7 is a schematic diagram illustrating a transfer apparatus 102 mounting a circuit board M on a mount surface 2a of a rotary table 2.

As illustrated in FIG. 7, a board inspection unit 101 includes the transfer apparatus 102, a circuit board inspecting apparatus 1, an orientation correction control section 103, and an orientation detection section 104. The circuit board inspecting apparatus 1 is similar in configuration to the circuit board inspecting apparatus 1 according to each of the foregoing embodiments. Therefore, the circuit board inspecting apparatus 1 will not be described here.

The transfer apparatus 102 takes a circuit board M out of a board accommodation section C in which a plurality of circuit boards M are accommodated, and transfers the circuit board M to the circuit board inspecting apparatus 1. The transfer apparatus 102 is, for example, an articulated robot arm apparatus. That is, the transfer apparatus 102 is provided at its distal end with a holding section 102a for holding a circuit board M. The holding section 102a holds the circuit board M from below.

The orientation detection section 104 is located at the distal end of the transfer apparatus 102. The orientation detection section 104 detects an orientation of the circuit board M held by the holding section 102a of the transfer apparatus 102. The orientation detection section 104 is, for example, a camera.

The orientation correction control section 103 controls an orientation of the transfer apparatus 102 in accordance with the orientation of the circuit board M detected by the orientation detection section 104. Specifically, the orientation correction control section 103 controls the orientation of the transfer apparatus 102 in order to correct the orientation of the circuit board M such that the circuit board M is placeable at a predetermined position on the mount surface 2a of the rotary table 2 in the circuit board inspecting apparatus 1.

According to the foregoing configuration, in transferring a circuit board M using the transfer apparatus 102, the orientation of the circuit board M can be corrected such that the circuit board M is placed at a predetermined position on the mount surface 2a of the rotary table 2 with ease. This configuration therefore eliminates a necessity to greatly correct the orientation of the circuit board M mounted on the mount surface 2a of the rotary table 2. This configuration thus reduces a time for inspecting the circuit board M.

The board inspection unit 101 includes: the transfer apparatus 102 capable of transferring a circuit board M to the rotary table 2 and capable of changing an orientation of the circuit board M in transferring the circuit board M to the rotary table 2; and the orientation correction control section 103 configured to control a driven state of the transfer apparatus 102, thereby correcting the orientation of the circuit board M such that the circuit board M is placeable at a predetermined position on the rotary table 2.

With this configuration, the board inspection unit 101 corrects the orientation of the circuit board M before placing the circuit board M on the rotary table 2, and therefore does not need a space for changing the orientation of the circuit board M, which has been required in the conventional art. The board inspection unit 101 also reduces a takt time for an inspection of a circuit board M.

The board inspection unit 101 further includes the orientation detection section 104 configured to detect the orientation of the circuit board M transferred by the transfer apparatus 102. The orientation correction control section 103 corrects the orientation of the circuit board M, based on a result of the detection on the orientation of the circuit board M by the orientation detection section 104.

With this configuration, the board inspection unit 101 is capable of accurately detecting the orientation of the circuit board M transferred by the transfer apparatus 102. The board inspection unit 101 is thus capable of accurately placing the circuit board M at the predetermined position on the rotary table 2.

The orientation detection section 104 may detect the orientation of the circuit board M transferred by the transfer apparatus 102, by detecting a detection target portion of the circuit board M. The orientation correction control section 103 corrects the orientation of the circuit board M, based on a result of detection on the orientation of the circuit board M by the orientation detection section 104, thereby locating the detection target portion detected by the orientation detection section 104 at a reference position of the rotary table 2. The board inspection unit 101 is thus capable of accurately placing the circuit board M at a predetermined position on the rotary table 2.

The transfer apparatus 102 is an articulated robot arm apparatus having a plurality of joint portions. The articulated robot arm apparatus transfers a circuit board M onto the rotary table 2 while supporting the circuit board M from below. The articulated robot arm apparatus is used for transferring a circuit board M while lifting the circuit board M from below, which prevents adhesion of dust to the circuit board M.

The present disclosure is applicable to, for example, an inspection apparatus for inspecting a circuit board.

Features of the above-described embodiments and the modifications thereof may be combined appropriately as long as no conflict arises.

While embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A circuit board inspecting apparatus for inspecting a circuit board,
   the circuit board inspecting apparatus comprising:
   a rotary table having a mount surface on which the circuit board is mountable while being adsorbed,
   the rotary table being rotatable about an axis of rotation as seen from the mount surface in plan view;
   a rotary table support section supporting the rotary table such that the rotary table is rotatable;
   a suction device;
   a suction path having a first end connected to the suction device and a second end located at the mount surface;
   an adsorption mechanism configured to adsorb the circuit board mounted on the mount surface onto the mount surface in such a manner that the suction device sucks in gas in the suction path;

a flow rate detection section configured to detect a flow rate of gas flowing through a portion of the suction path, the portion located inside the rotary table support section;

a flow rate determination section configured to determine whether the flow rate of the gas detected by the flow rate detection section is equal to or more than a predetermined value;

a contactless detection section configured to detect a placement state of the circuit board on the mount surface in a contactless manner; and an inspection section configured to inspect the circuit board in accordance with results of detection by the flow rate determination section and contactless detection section.

2. The circuit board inspecting apparatus according to claim 1, wherein the suction path includes:

a central suction path located at a center of the mount surface; and an outer peripheral suction path located radially outside the central suction path, and the flow rate detection section detects a flow rate of gas flowing through a portion of the central suction path, the portion located inside the rotary table support section.

3. The circuit board inspecting apparatus according to claim 1, wherein the inspection section inspects the circuit board when the flow rate determination section determines that the flow rate of the gas detected by the flow rate detection section is smaller than the predetermined value and when the contactless detection section detects that the circuit board is placed on the mount surface in a predetermined state.

4. The circuit board inspecting apparatus according to claim 3, wherein the inspection section includes a contact inspection section configured to inspect the circuit board in contact with the circuit board, the contactless detection section includes:

a circuit board contactless detection section configured to detect presence or absence of the circuit board on the mount surface in a contactless manner; and a height position contactless detection section configured to detect a height of the circuit board relative to the mount surface at a portion closer to a contact position where the contact inspection section is in contact with the circuit board than an outer edge of the circuit board is, in a contactless manner, and the predetermined state to be detected by the contactless detection section includes a case where the circuit board contactless detection section detects that the circuit board is located at a predetermined position on the mount surface and a case where the height position contactless detection section detects that the height of the circuit board relative to the mount surface is equal to or less than a predetermined value.

5. The circuit board inspecting apparatus according to claim 4, wherein the height position contactless detection section detects a height of the contact position, where the contact inspection section is in contact with the circuit board, relative to the mount surface in a contactless manner.

6. The circuit board inspecting apparatus according to claim 1, wherein the circuit board includes a plurality of board pieces each having an electric circuit fabricated thereon, and prior to an inspection of the electric circuit on each board piece, the flow rate determination section determines that the flow rate of the gas detected by the flow rate detection section is smaller than the predetermined value and the contactless detection section detects the placement state of the circuit board on the mount surface, and then the inspection section inspects each electric circuit.

7. The circuit board inspecting apparatus according to claim 2, wherein the suction device is connected to both the central suction path and the outer peripheral suction path.

8. The circuit board inspecting apparatus according to claim 2, wherein the inspection section inspects the circuit board when the flow rate determination section determines that the flow rate of the gas detected by the flow rate detection section is smaller than the predetermined value and when the contactless detection section detects that the circuit board is placed on the mount surface in a predetermined state.

9. The circuit board inspecting apparatus according to claim 2, wherein the circuit board includes a plurality of board pieces each having an electric circuit fabricated thereon, and prior to an inspection of the electric circuit on each board piece, the flow rate determination section determines that the flow rate of the gas detected by the flow rate detection section is smaller than the predetermined value and the contactless detection section detects the placement state of the circuit board on the mount surface, and then the inspection section inspects each electric circuit.

10. The circuit board inspecting apparatus according to claim 3, wherein the circuit board includes a plurality of board pieces each having an electric circuit fabricated thereon, and prior to an inspection of the electric circuit on each board piece, the flow rate determination section determines that the flow rate of the gas detected by the flow rate detection section is smaller than the predetermined value and the contactless detection section detects the placement state of the circuit board on the mount surface, and then the inspection section inspects each electric circuit.

11. The circuit board inspecting apparatus according to claim 4, wherein the circuit board includes a plurality of board pieces each having an electric circuit fabricated thereon, and prior to an inspection of the electric circuit on each board piece, the flow rate determination section determines that the flow rate of the gas detected by the flow rate detection section is smaller than the predetermined value and the contactless detection section detects the placement state of the circuit board on the mount surface, and then the inspection section inspects each electric circuit.

12. The circuit board inspecting apparatus according to claim 5, wherein the circuit board includes a plurality of board pieces each having an electric circuit fabricated thereon, and prior to an inspection of the electric circuit on each board piece, the flow rate determination section determines that the flow rate of the gas detected by the flow rate detection section is smaller than the predetermined value and the contactless detection section detects the placement state of the circuit board on the mount surface, and then the inspection section inspects each electric circuit.

\* \* \* \* \*